United States Patent
Lee et al.

(10) Patent No.: US 7,576,723 B2
(45) Date of Patent: Aug. 18, 2009

(54) DRIVING APPARATUS FOR DISPLAY DEVICE AND DISPLAY PANEL THEREOF

(75) Inventors: Seong-Young Lee, Seoul (KR); Sung-Man Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 701 days.

(21) Appl. No.: 10/971,365

(22) Filed: Oct. 22, 2004

(65) Prior Publication Data

US 2005/0275609 A1 Dec. 15, 2005

(30) Foreign Application Priority Data

Jun. 9, 2004 (KR) .................... 10-2004-0042232

(51) Int. Cl.
*G09G 3/36* (2006.01)
*G02F 1/1343* (2006.01)

(52) U.S. Cl. .................... 345/98; 345/204; 349/141

(58) Field of Classification Search ............ 257/59, 257/412; 345/98, 100, 204; 349/113, 141
See application file for complete search history.

(56) References Cited

U.S. PATENT DOCUMENTS

| | | | | | |
|---|---|---|---|---|---|
| 5,191,240 | A | * | 3/1993 | Fleischer | 326/84 |
| 6,144,082 | A | * | 11/2000 | Yamazaki et al. | 257/412 |
| 6,144,429 | A | * | 11/2000 | Nakai et al. | 349/113 |
| 6,621,546 | B2 | * | 9/2003 | Yang et al. | 349/141 |
| 6,911,694 | B2 | * | 6/2005 | Negoro et al. | 257/336 |
| 7,030,953 | B2 | * | 4/2006 | Yanagawa et al. | 349/141 |
| 7,189,994 | B2 | * | 3/2007 | Arao | 257/59 |
| 2003/0058396 | A1 | * | 3/2003 | Shih | 349/141 |

* cited by examiner

*Primary Examiner*—Kevin M Nguyen
(74) *Attorney, Agent, or Firm*—Haynes and Boone, LLP

(57) ABSTRACT

In accordance with one or more embodiments of the present invention, a driving portion of a display device is formed on the same plane as a display portion of a display device. The driving portion includes cumulative layers of a control electrode, a first insulating layer, a semiconductor layer, a second insulating layer, an input electrode, an output electrode, and an auxiliary layer on top of the layers. Thus, the transistors within the driving portion may be more compact, while possibly reducing the likelihood of a short circuit between the electrodes.

16 Claims, 9 Drawing Sheets

US 7,576,723 B2

DRIVING APPARATUS FOR DISPLAY DEVICE AND DISPLAY PANEL THEREOF

RELATED APPLICATIONS

This application claims the benefit and priority of Korean Patent Application Serial No. 10-2004-0042232, filed Jun. 9, 2004, which is incorporated herein by reference in its entirety.

TECHNICAL FIELD

The present invention relates to display devices and, more particularly, to drive circuits and displays utilizing the drive circuits.

BACKGROUND

Flat panel display devices, such as an organic light emitting display (OLED), a plasma display panel (PDP), or a liquid crystal display (LCD), have been actively developed and are increasingly preferred over the heavy and bulky displays based on cathode ray tube (CRT) technology. In general, a PDP displays characters and/or images by using plasma obtained by a gas discharge, while an OLED displays characters and/or images by generating electronic luminescence of specific organic and/or polymeric materials. Furthermore, in general, an LCD displays characters and/or images by changing an intensity of light passed through the liquid crystal layer, which is located in between two conductive layers and controlled by the current therebetween.

Among the flat panel displays, both LCD and OLED have a display portion and a gate driving portion. The display portion includes pixels, having a switching element in each pixel, and signal wires for transmitting signals to the switching element of the pixels. The gate driving portion includes shift registers for switching on and off the pixel elements.

Each of the shift registers includes a plurality of interconnected stages. Each stage may include an input portion, an output portion, and a discharging portion for transmitting signals according to the combination of the output signal of the previous or latter stages and a clock signal.

The output portion of the stage may include a number of transistors, which are connected to the gate wires and to the other stages. For these transistors, a gate signal output transistor consumes approximately 40 to 50 percent of the whole stage area to have sufficient power to transmit signals onto the gate lines and to former stages. Furthermore, for example, to minimize ripple, the gate signal output transistor (e.g., NMOS transistor) generally has more capacitance between its gate and drain than between its gate and source.

Accordingly, to provide sufficient capacitance between the gate and the source, the gate and the source are enlarged to provide a broader overlap; thus, the gate signal output transistor's area is automatically increased based on the capacitance required. For this reason, the design rules may not permit adequate margin for circuit design and architecture, depending upon the design requirements or desired design application. Also, the broader overlap raises the possibility of a short circuit between the source and gate of the gate signal output transistor that will result in a gate signal output failure.

This drawback may be especially apparent when an application has a narrow black matrix area, resulting in the display device (e.g., for a notebook computer) not having enough area for the manufacturing seal process (i.e., the adhesion process of the upper plate and the lower plate of the display device). Accordingly, there is a need for a display device with a gate driving portion that may overcome one or more of the disadvantages of conventional systems, such as those discussed above.

SUMMARY

Systems and methods are disclosed herein to provide display devices and/or associated circuitry. For example, in accordance with an embodiment of the present invention, a driving apparatus of a display device includes a plurality of interconnected stages that generate sequential signals. Each stage includes a driving portion, which is charged in response to an input signal and transmits an output signal according to a clock signal, and a discharging portion, which discharges the voltage of the driving portion in response to the output signal of a latter stage. The input signal may be either a scan starting signal or an output signal of one of the previous stages.

The driving portion, in accordance with an embodiment of the present invention, may include a control electrode on a substrate, a first insulating layer on the control electrode, a semiconductor layer on the first insulating layer, an input electrode at least partially formed on the semiconductor layer, an output electrode at least partially formed on the semiconductor layer and overlapped with the control electrode, a second insulating layer on the input electrode and the output electrode, and an auxiliary electrode which is formed on the second insulating layer, connected to the control electrode, and overlapped with the output electrode.

Each of the input and output electrodes, in accordance with an embodiment of the present invention, may include a plurality of branches disposed like the teeth of a comb, each of which is located alternatively, for example in one by one (interdigitated), in one by two or in a similar manner, and the output electrode further includes an extension portion that is connected to the branches and overlapped with the control electrode and the auxiliary electrode.

The first and second insulating layer, in accordance with an embodiment of the present invention, may include a contact hole that exposes a portion of the control electrode. The auxiliary electrode may be connected to the control electrode via the contact hole. The auxiliary electrode, for example, is made of a transparent conductive material, such as an indium tin oxide (ITO) and/or an indium zinc oxide (IZO).

The capacitance between the control electrode and the output electrode may preferably be greater than the capacitance between the control electrode and input electrode. The semiconductor layer, for example, may be made of an amorphous silicon. Furthermore, the driving portion may be formed on the same plane as the display portion of the display device.

In accordance with another embodiment of the present invention, a display plate may include a substrate, a plurality of gate lines accompanying a plurality of first control electrodes, a second control electrode formed on the substrate and isolated from the gate lines, a first insulating layer on the gate lines and the second control electrode, a first and a second semiconductor layer on the first and the second control electrode, respectively, a plurality of data lines on the first insulating layer and at least partially connected to the semiconductor layer, a plurality of first output electrodes at least partially connected to the first semiconductor layer and isolated from the data lines, a second input electrode at least partially connected to the second semiconductor layer, a second output electrode which is isolated from the second input electrode, at least partially overlapped with the second control electrode, and electrically connected to the gate line, a second insulating layer formed on the data lines, the second input electrode portion, the first output electrode portion and the second output electrode portion, a plurality of pixel electrodes formed on the second insulating layer and connected to the first output electrode portion, and an auxiliary electrode formed on the second insulating electrode, connected to the second control electrode, and overlapped with the second output electrode portion.

Each of the second input and output electrodes, in accordance with an embodiment of the present invention, includes a plurality of branches disposed like the teeth of a comb, each of which is located alternatively, for example in one by one (interdigitated), in one by two or in a similar manner. The second output electrode further may include an extension portion that is connected to the branches and overlapped with the second control electrode and the auxiliary electrode.

The first and the second insulating layer, in accordance with an embodiment of the present invention, may include a contact hole that exposes a portion of the second control electrode. The auxiliary electrode may be connected to the second control electrode via the contact hole. The auxiliary electrode, for example, may be made of a transparent conductive material, such as ITO and/or IZO.

The capacitance between the second control electrode and the second output electrode may preferably be greater than the capacitance between the second control electrode and the second input electrode. The semiconductor layer, for example, may be made of an amorphous silicon.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

Figure 1:
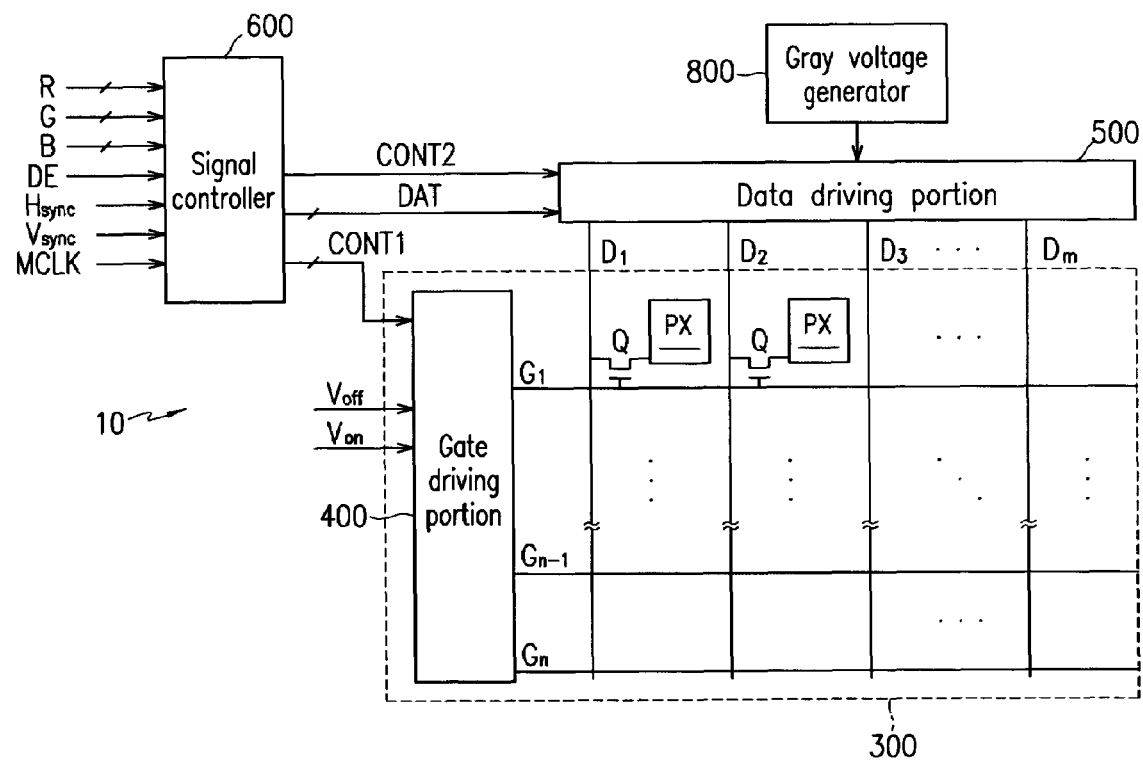
FIG. 1 is a block diagram of a display device in accordance with an embodiment of the present invention.

Embodiments of the present invention and their advantages are best understood by referring to the detailed description that follows. It should be appreciated that like reference numerals are used to identify like elements illustrated in one or more of the figures. Furthermore in the figures, such as for example when illustrating semiconductor layers, the elements or layers may not be drawn to scale and may be magnified to clearly illustrate the figure elements. Also, use of the words "above" or "on" may be used for example to refer to a position of a layer, an area, or a plate relative to another referenced element, but would not rule out an intermediate element disposed between the referenced element and the layer, area, or plate. However, "directly above" or "directly on" for example implies no intermediate element between the referenced element and the layer, area, or plate.

DETAILED DESCRIPTION

Figure 2:
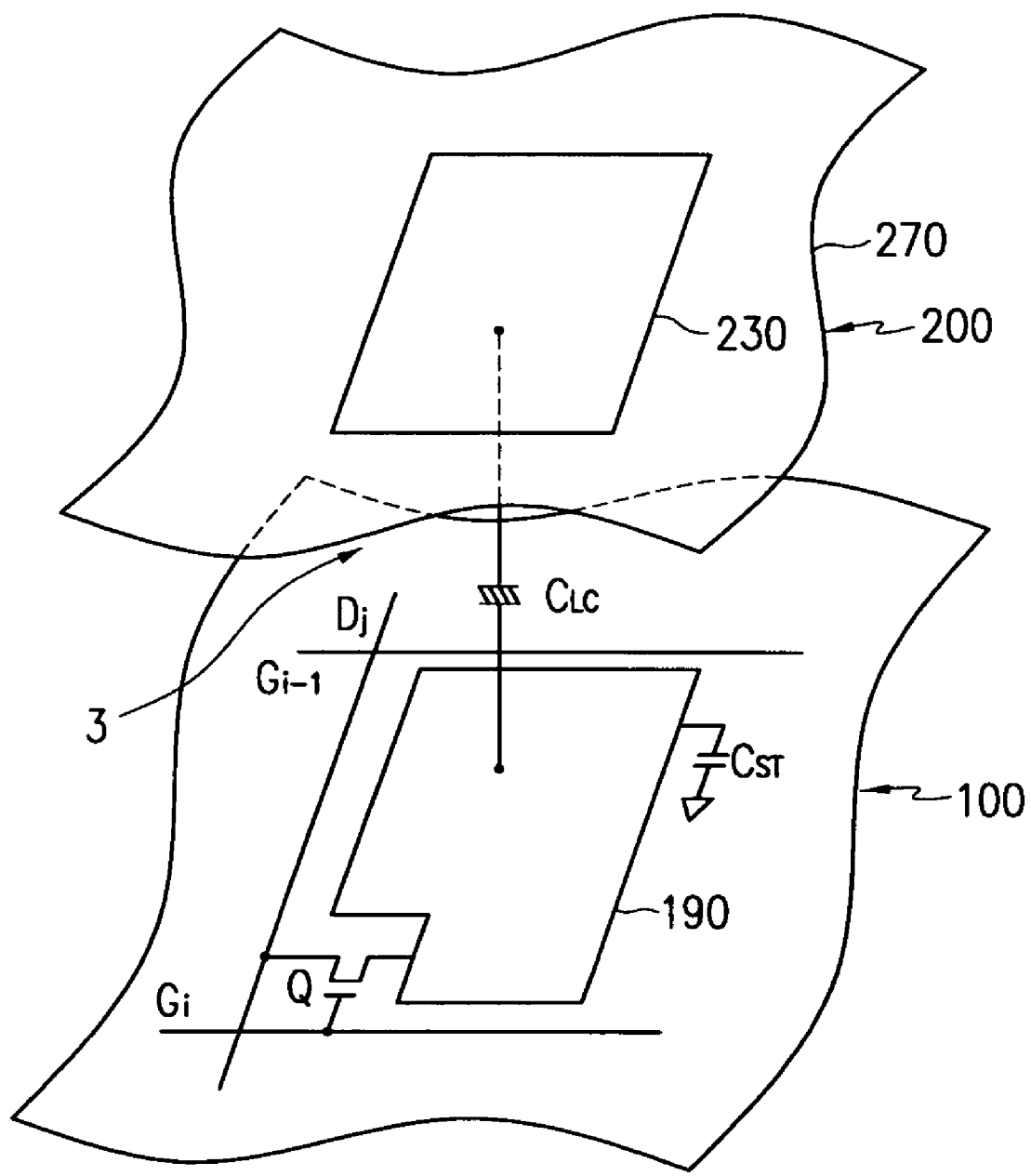
FIG. 2 is an exemplary equivalent circuit for one of the pixels of an LCD in accordance with an embodiment of the present invention.

FIG. 1 is a block diagram of a display device 10 in accordance with an embodiment of the present invention, while FIG. 2 is an exemplary equivalent circuit for one of the pixels of an LCD of the display device in accordance with an embodiment of the present invention. As shown in FIG. 1, display device 10 includes a display portion 300, a gate driving circuit 400 connected to the display portion 300, a data driving circuit 500 also connected to the display portion 300, a gray voltage generator 800 connected to the data driving circuit 500, and a signal controller 600. The display portion 300 and the gate driving circuit 400, for example in accordance with an embodiment of the present invention, may be formed as a single plate, such as on a first plate 100 or a second plate 200 of FIG. 2.

Display portion 300 includes a plurality of pixels, shown as $P_x$ and Q, arranged in a matrix and connected to a plurality of display signal lines, labeled $G_1$-$G_n$ and $D_1$-$D_m$. The display signal lines $G_1$-$G_n$ and $D_1$-$D_m$ represent a plurality of gate lines $G_1$-$G_n$ for delivering gate signals and a plurality of data lines $D_1$-$D_m$ for delivering data signals. Each of the gate lines $G_1$-$G_n$ are horizontally extended approximately in parallel to each other and each of the data lines $D_1$-$D_m$ are vertically extended approximately in parallel to each other.

Each pixel includes a switching element Q, connected to the display signal lines $G_1$-$G_n$, $D_1$-$D_m$, and a pixel circuit $P_x$ connected to the switching element Q. The switching element Q is connected to one of the gate lines $G_1$-$G_n$, one of the data lines $D_1$-$D_m$, and one of the pixel circuits $P_x$. The switching element Q is, for example, a TFT, which may be made from amorphous silicon.

Display portion 300, in accordance with an embodiment of the present invention, may represent an LCD or an OLED. If display portion 300 is an LCD, for example, then as shown in FIG. 2, display portion 300 includes a liquid crystal layer 3 disposed between a first plate 100, having the display signal lines $G_1$-$G_n$, $D_1$-$D_m$, and a second plate 200. The pixel circuit $P_x$ includes a liquid crystal capacitor $C_{LC}$, with a parallel connection to the switching element Q and a storage capacitor $C_{ST}$, with the storage capacitor an optional component.

The liquid crystal dielectric substance forms the capacitor $C_{LC}$, which is located between two terminals, a pixel electrode 190 of first plate 100 and a common electrode 270 of second plate 200. Pixel electrode 190 is connected to the switching element Q, while the common electrode 270 may be formed substantially on the entire surface of second plate 200 and charged with a common electrode voltage $V_{com}$. Alternatively, common electrode 270 may be formed on first plate 100 with the two electrodes 190, 270 formed for example as bar shapes.

First plate 100 further includes separated signal lines (not shown), which are charged with a predetermined voltage such as the common electrode voltage $V_{COM}$. The separated signal lines are overlapped with the pixel electrode 190 to form the storage capacitor $C_{ST}$. The storage capacitor $C_{ST}$ can also be made by interposing an insulating layer between pixel electrode 190 and a previous gate line.

For color applications, each pixel may include a red, blue or green color filter 230 for the corresponding pixel electrode 190. Color filter 230 may be formed on second plate 200, as shown in FIG. 2, or on or below pixel electrode 190 on first plate 100. At least one of the plates 100, 200 has a polarizer (not shown) on its outer face for passing polarized light.

Referring to FIG. 1, gray voltage generator 800 generates one or two pairs of gray voltages according to the passing light intensity of each pixel. For two pairs of gray voltages, each pair has opposite polarities relative to the common electrode voltage $V_{COM}$.

Gate driving circuit 400 is integrated on the same plane with display portion 300 and transmits gate signals, the combination of a gate-on signal $V_{on}$ and a gate-off signal $V_{off}$, via the gate lines $G_1$-$G_n$. Data driving circuit 500 is connected to the data lines $D_1$-$D_m$ and transmits data signals according to the gray signal voltages of gray voltage generator 800. Signal controller 600 controls gate driving circuit 400 and data driving circuit 500.

The detailed operations of display device 10 are explained next. An external graphic controller (not shown) provides input image signals R, G, B and input control signals, such as a vertical sync signal $V_{sync}$, a horizontal sync signal $H_{sync}$, a main clock MCLK, and a data enable signal DE to signal controller 600.

Signal controller 600 generates a gate control signal CONT1 and a data control signal CONT2 on the basis of the input control signals and the input image signals R, G, B; converts the original image signals R, G, B to a modified image signal DAT in accordance with the operational conditions or specifications of display portion 300; and transmits the gate control signal CONT1 to gate driving circuit 400 and both the data control signal CONT2 and the modified image signal DAT to data driving circuit 500.

The gate control signal CONT1 includes a start vertical signal STV for initiating the gate-on signal $V_{on}$, a gate clock signal CPV for controlling the timing of the gate-on signal $V_{on}$, and an output enable signal OE for limiting the duration time of the gate-on signal $V_{on}$.

The data control signal CONT2 includes a horizontal sync start signal STH for initiating the input of the image data from the modified image signal DAT, a loading signal LOAD that controls the loading of the data signals for the data lines $D_1$-$D_m$, and a data clock signal HCLK. The data control signal CONT2 of an LCD can further include an inversion signal RVS for inversion of the polarity of the data voltage to the common signal voltage $V_{COM}$.

Data driving circuit 500 sequentially receives image data from modified image signal DAT (which is transmitted later to the pixels in one row of display portion 300) from signal controller 600; converts the image data from modified image signal DAT to pixel data voltages by selecting predetermined gray voltages of the image data from modified image signal DAT; and transmits the converted pixel data voltages to data lines $D_1$-$D_m$. Gate driving circuit 400 turns on the switching element Q for each of the pixels by transmitting the gate-on signal $V_{on}$ via the gate lines $G_1$-$G_n$ according to the gate control signal CONT1. Finally, the data voltages, provided to the data lines $D_1$-$D_m$, are transmitted to each of the pixels via the corresponding switching elements Q, which are appropriately switched on.

Referring to FIG. 2, liquid crystal layer 3 is charged with a pixel voltage, which is the difference between the common electrode voltage $V_{COM}$ and the data signal voltage of the pixel. The liquid crystal molecules change their arrangement according to the pixel voltage, which controls the polarizations of the passing light. Ultimately, the polarized light is shown as a light intensity of the pixel after the light passes through the polarizer, attached on at least one of the plates 100, 200.

One horizontal period "1H" is the period of the horizontal sync signal $H_{sync}$, the data enable signal DE, and the gate clock CPV. After one horizontal period "1H," data driving circuit 500 and gate driving circuit 400 repeat the same operation for the pixels in the next row. In this way, over one frame period, all of the gate lines $G_1$-$G_n$ receive the gate-on voltage $V_{on}$ one by one so that all of the pixels receive their data voltages.

After one frame is completed, for the LCD depicted in FIG. 2, the next frame is initiated with a reversed polarity on each pixel, as controlled by the reverse signal RVS of data driving circuit 500 (referred to as frame inversion mode). Furthermore, within one frame, each of the data lines receives line by line polarities in line inversion mode, and each pixel receives pixel by pixel polarities in dot inversion mode.

Figure 3:
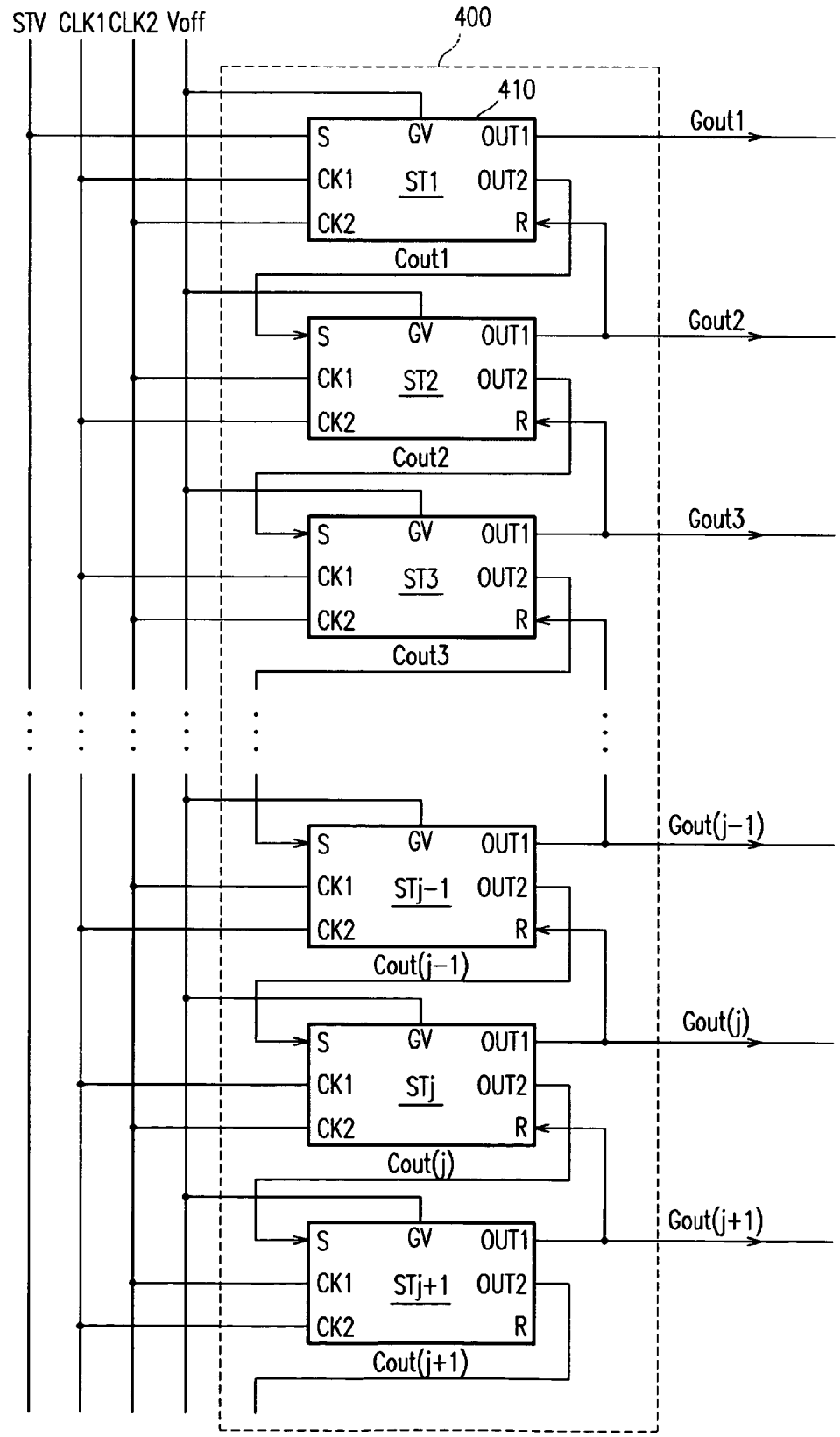
FIG. 3 is an exemplary block diagram of a gate driving portion in accordance with an embodiment of the present invention.
Figure 4:
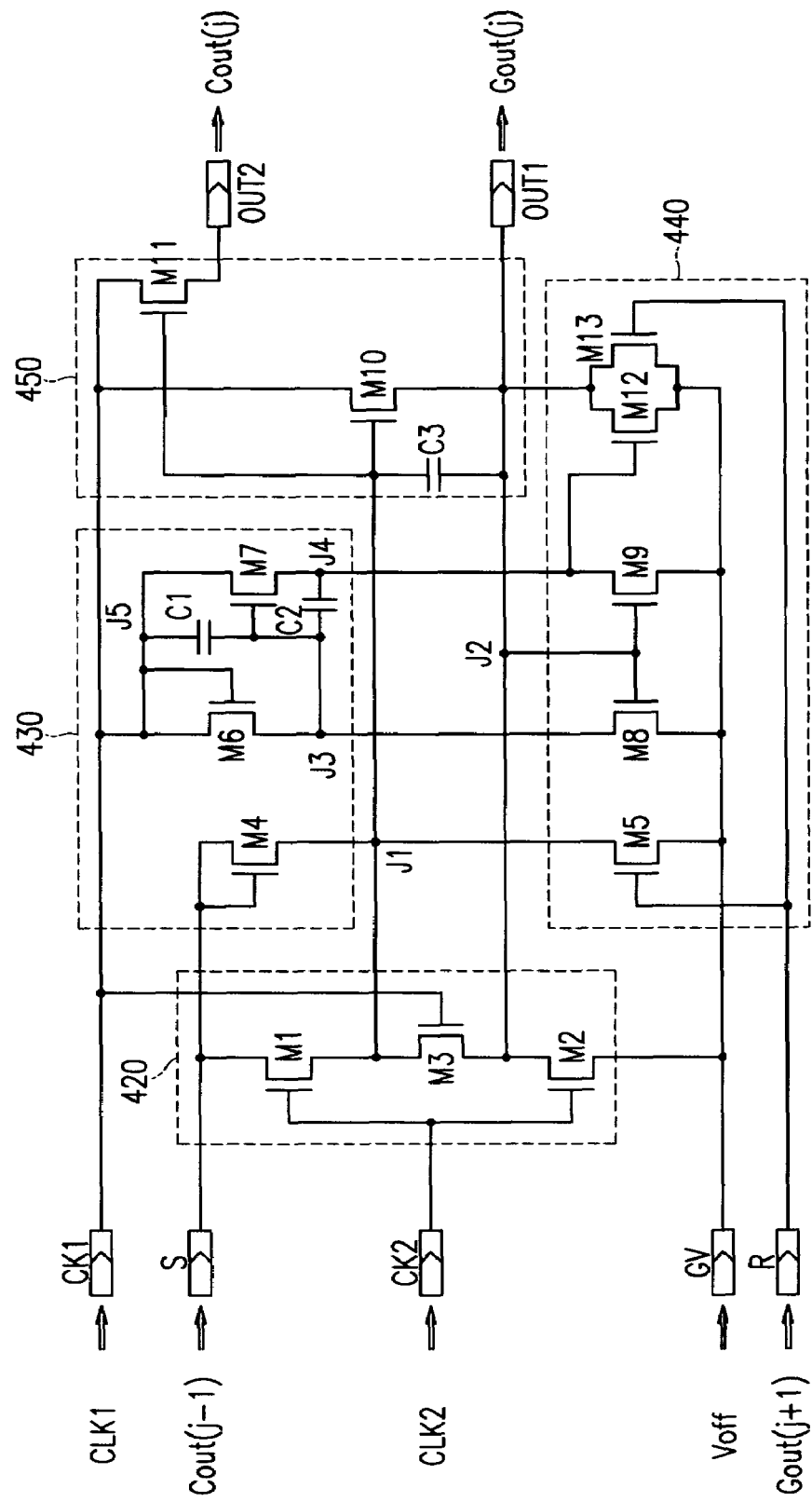
FIG. 4 is an exemplary circuit implementation of a jth stage of a shift register in a gate driving shift register of the gate driving portion in accordance with an embodiment of the present invention.
Figure 5:
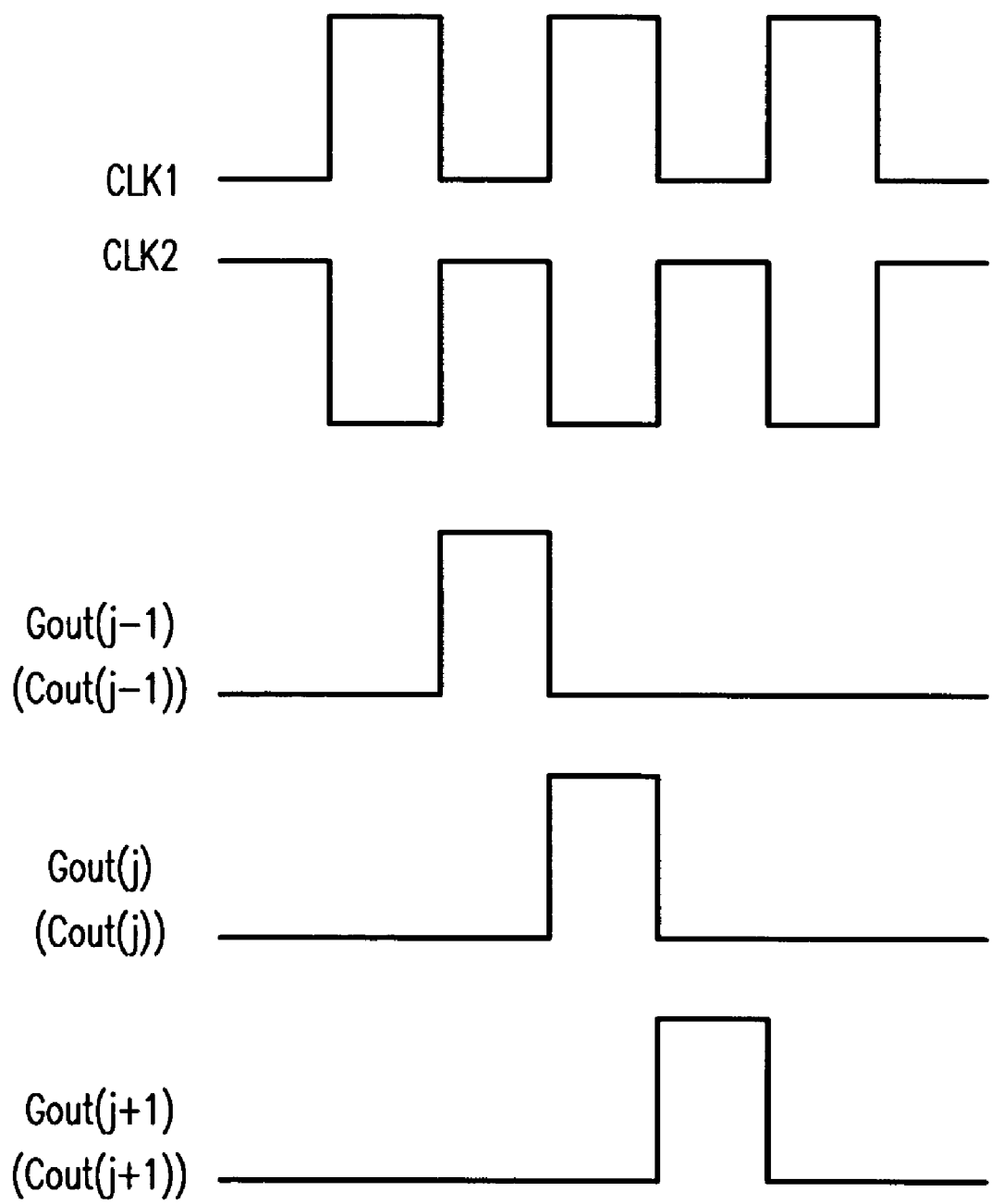
FIG. 5 is an exemplary signal waveform diagram for the gate driving portion in accordance with an embodiment of the present invention.

Now, referring to FIGS. 3-9, an exemplary implementation of gate driving circuit 400 is explained in detail according to one or more embodiments of the present invention. FIG. 3 is an exemplary block diagram of gate driving circuit 400 in accordance with an embodiment of the present invention. FIG. 4 is an exemplary circuit implementation of one stage (e.g., a jth stage) of a shift register of gate driving circuit 400 in accordance with an embodiment of the present invention. FIG. 5 is an exemplary signal waveform diagram for one stage of gate driving circuit 400 in accordance with an embodiment of the present invention.

As shown in FIG. 3, gate driving portion 400 is arranged in a line and has a plurality of stages 410 (labeled $ST_1$, $ST_2$, . . . , $ST_{j+1}$, where j+1 represents the number of stages 410) that are connected to the corresponding gate lines $G_1$-$G_n$ (labeled $G_{out1}$ through $G_{out}(J+1)$ in FIG. 3). Also, as a shift register, gate driving portion 400 receives a scan starting signal STV, a plurality of clock signals CLK1, CLK2, and the gate-off voltage $V_{off}$.

Each stage 410 includes a set terminal S, a pair of clock terminals CK1, CK2, a reset terminal R, a gate output terminal OUT1, and a carry output terminal OUT2. In each stage, for example a jth stage $ST_j$, the set terminal receives the carry output $C_{out}(j-1)$ of the previous stage $ST_{j-1}$, while the reset terminal R receives the gate output $G_{out}(j+1)$ of the next stage $ST_{j+1}$. Also, the pair of clock terminals CK1, CK2 receives the clock signals, and the gate voltage terminal GV receives the gate-off voltage $V_{off}$. The stage transmits a gate output $G_{out}(j)$ via the gate output terminal OUT1 and a carry out $C_{out}(j)$ via the carry output terminal OUT2.

However, the first stage of the shift register (i.e., $ST_1$) receives the scan starting signal STV instead of the previous carry out. If the clock terminal CK1 receives the clock signal CLK1 and the clock terminal CK2 receives the clock signal CLK2 in the jth stage $ST_j$, the neighboring stages, (j-1)th stage $ST_{j-1}$ and (j+1)th stage $ST_{j+1}$, receive CLK2 on the clock terminal CK1 and receive CLK1 on the clock terminal CK2.

For driving the switching element Q of the pixel, the high signals of the clock signals CLK1, CLK2 are the gate-on voltages $V_{on}$, while the low signals of the clock signals CLK1, CLK2 are the gate-off voltages $V_{off}$. As depicted in FIG. 5, each of the clock signals CLK1, CLK2 has a 50% duty ratio and a 180° phase difference.

Referring to FIG. 4, the jth stage of gate driving portion 400 includes an input portion 420, a pull-up driving portion 430, a pull-down driving portion 440, and an output portion 450. The jth stage includes transistors M1-M13 (e.g., NMOS transistors), with the pull-up driving portion 430 and the output portion 450 further including capacitors C1-C3. Although NMOS transistors are illustrated, it should be understood that PMOS transistors or other types of transistors may be used instead of the NMOS transistors. Also, the capacitors c1-C3 can be a parasitic capacitor between the drain and the source, formed during manufacturing as is known in the art.

Input portion 420 includes a set terminal S and three transistors M1, M2, M3, connected in series to the gate voltage terminal GV. The gates of the two transistors M1, M2 and the gate of transistor M3 are respectively connected to the clock terminals CK2 and CK1. The junction point between the transistor M1 and the transistor M3 is connected to the junction point J1, and the junction point between the transistor M2 and the transistor M3 is connected to the junction point J2.

Pull-up driving portion 430 comprises a transistor M4 between the set terminal S and junction point J1, a transistor M6 between the clock terminal CK1 and the junction point J3, and the transistor M7 between the clock terminal CK1 and the junction point J4. The gate and the drain of the transistor M4 are commonly connected to the set terminal S, while the source is connected to the junction point J1. Similarly, the gate and the drain of the transistor M6 are commonly connected to the clock terminal CK1, while the source is connected to the junction point J3.

The gate of the transistor M7 is simultaneously connected to the junction point J3 and the clock terminal CK1. The drain of the transistor M7 is connected to the clock terminal CK1. The source of the transistor M7 is connected to the junction point J4. The capacitor C2 is located between the junction J3 and the junction J4.

Pull-down driving portion 440 includes a plurality of transistors M5, M8, M9, M12, and M13, which have sources for receiving the gate off voltage $V_{off}$ and drains for transferring the gate off voltage $V_{off}$ to junction points J1, J2, J3, and J4. The transistor M5 has a gate connected to the reset terminal R, and a drain connected to the junction point J1. The transistors M8, M9 have their gates commonly connected to the junction point J2, and their drains connected to the junctions J3 and J4, respectively. The transistors M12, M13 each have a gate connected to the junction point J4 and to the reset terminal, respectively, and a drain, which is commonly connected to the junction point J2.

The output portion 450 includes two transistors M10, M11 and a capacitor C3. The gates of the transistors M10 and M11 are commonly connected to the junction point J1, while their drains are connected to the clock terminal CK1. The transistors M10 and M11 have their sources respectively coupled to the output terminals OUT1 and OUT2. The capacitor C3 is between the junction point J1 and J2. The source of transistor M10 is also connected to the junction point J2.

The operation of the exemplary stage of FIG. 4 is explained next. The high signal level of the clock signals CLK1, CLK2 is called a "high signal" throughout this specification; the low signal level of the clock signals CLK1, CLK2 is called a "low signal" and may be substantially the same as the gate off voltage $V_{off}$.

With the high signal of both of the clock signal CLK2 and the previous carry output $C_{out}(j-1)$, the transistors M1, M2, and M4 are turned on. Then, the two transistors M1 and M4 transmit high signal to the junction point J1, while the transistor M2 transmits low signal to the junction point J2. Thereafter, the transistors M10 and M11 are turned on and the clock signal CLK1 is transmitted from output terminal OUT1, OUT2.

Because the signal of the junction point J2 and the clock signal CLK1 are low signal, the output signals $G_{out}(j)$, $C_{out}(j)$ are low signals; simultaneously, the capacitor C3 recharges to the difference between the high signal and the low signal.

At this time, because the signal clock CLK1, the gate output $G_{out}(j+1)$, and the junction point J2 are all low voltage, the connected transistors M3, M5, M6, M8, M9, and M13 are all switched off.

Subsequently, the transistors M1, M2 are turned off when the clock signal CLK2 is low; simultaneously, the output signal of the transistor M10 and the signal of the junction point J2 are high signal when the clock signal CLK1 is high signal. At this time, because the gate and the source of the transistor M3 have high signal, the zero voltage difference turns off the transistor M3. Accordingly, the high signal of the capacitor C3 is added to the floating junction point J1.

The high signal of the clock signal CLK1 and the junction point J2 turn on the transistors M6, M8, and M9. The directly connected transistors M6, M8 are in between the high signal and the low signal and decide the divided potential of the junction point J3 according to the resistance of the turned on transistors, M6, M8.

Here, if the resistance of the transistor M8 on its turn-on state is greater than the resistance of the transistor M6 on its turn-on state (e.g., 10,000 times greater), the voltage of the junction point J3 is substantially the same as the high signal. Subsequently, the transistor M7 is turned on, and the voltage of the junction point J4 is decided by the turn-on resistance of the transistors M7, M9.

With the transistors M7, M9 having substantially the same resistance, the junction point J4 has a middle voltage between the high signal and the low signal; thus, the transistor M12 remains turned off. Also, the transistors M5, M13 remain turned off because the latter gate output $G_{out}(j+1)$ stays at low signal.

Accordingly, the output terminals OUT1, OUT2 transmit high signal by being isolated from low signal and being connected to the clock signal CLK1. The capacitors C1 and C2 are charged by the potential difference of each terminal, and the potential of the junction point J3 is lower than the potential of the junction point J5.

Later, having high signal on both the latter gate output signal $G_{out}(j+1)$ and the clock signal CLK2 and low signal on the clock signal CLK1, the transistors M5, M13 are turned on and transmit low signal to the junction points J1, J2. The voltage of the junction point J1 is lowered by discharging the capacitor C3 to the low voltage during a certain time.

Accordingly, the two transistors M10, M11 remain turned on for the time being after the latter gate output $G_{out}(j+1)$ has high signal; then, the output terminals OUT1, OUT2 transmit low signal, being connected to the clock signal CLK1. Next, when the capacitor C3 is completely discharged and the junction point J1 voltage becomes the low signal, the transistor M11 is turned off to make the output terminal cut off; thus, the carry output $C_{out}(j)$ remains a low signal by being isolated.

Next, the carry output $C_{out}(j)$ is floating and remains a low signal because the output terminal OUT2 is isolated from the clock signal CLK1 by turning off the transistor M11, which resulted from the complete discharge of the capacitor C3 and the low voltage of the junction point J1. Simultaneously, even when the transistor M10 is turned off, the output terminal OUT1 continuously transmits low voltage because of the connection with the low signal via transistor M13.

On the other hand, the junction point J3 is isolated because of the switched off transistors M6, M8. Also, the voltage of the junction point J5 is lower than the voltage of the junction point J4, and the transistor M7 is switched off because the voltage of the junction point J3 remains lower than the voltage of the junction point J5 by the capacitor C1. Simultaneously, due to the transistor M9 being switched off, the voltage of the junction point J4 is lowered, and the transistor M3 remains turned off. Also, the transistor M3 remains turned off because its gate is connected to the low voltage of the clock signal and the signal of the junction point J2 is low.

Next, with high clock signal CLK1, the transistors M6, M7 are turned on, and with the rising voltage, the transistor M12 is turned on and transmits low signal to the junction point J2 to make the output terminal out1 transmit the low signal. That is, even though the output of the latter gate $G_{out}(j+1)$ has low signal, the voltage of the junction point J2 may be low signal.

On the other hand, having a gate connected to the high clock signal CLK1 and low signal junction point J2, the transistor M3 is turned on and transmits the low voltage of the junction point J2 to the junction point J1. The drains of the transistors M10, M11 receive the clock signal CLK1 continuously because the drains are connected to the clock terminal CK1. Furthermore, the transistor M10 is larger than the other transistors M11; thus, the change of the drain voltage can affect the gate voltage because of the enlarged parasitic capacitor between the gate and the drain.

Therefore, with the high clock signal CLK1, the transistor M10 can be turned on due to the parasitic capacitor between the gate and the drain. To prevent switching on the transistor M10, the gate signal of the transistor M10 is maintained as low signal by transmitting the low signal of the junction point J2 to the junction point J1.

Later on, until the previous carry output $C_{out}(j-1)$ has high voltage, the junction point J1 maintains the low signal. The junction point J2 maintains low voltage via the transistor M12 when the clock signal CLK1 is high and the clock signal CLK2 is low; otherwise, with low clock signal CLK1 and high clock signal CLK2, the junction point J2 maintains low voltage via the transistor M2.

As explained above, the $ST_J$ stage 410 generates carry signal $C_{out}(j)$ and gate signal $G_{out}(j)$ based on the previous carry signal $C_{out}(j-1)$, the latter gate signal $G_{out}(j+1)$, the clock signal CLK1, and the clock signal CLK2.

Figure 6:
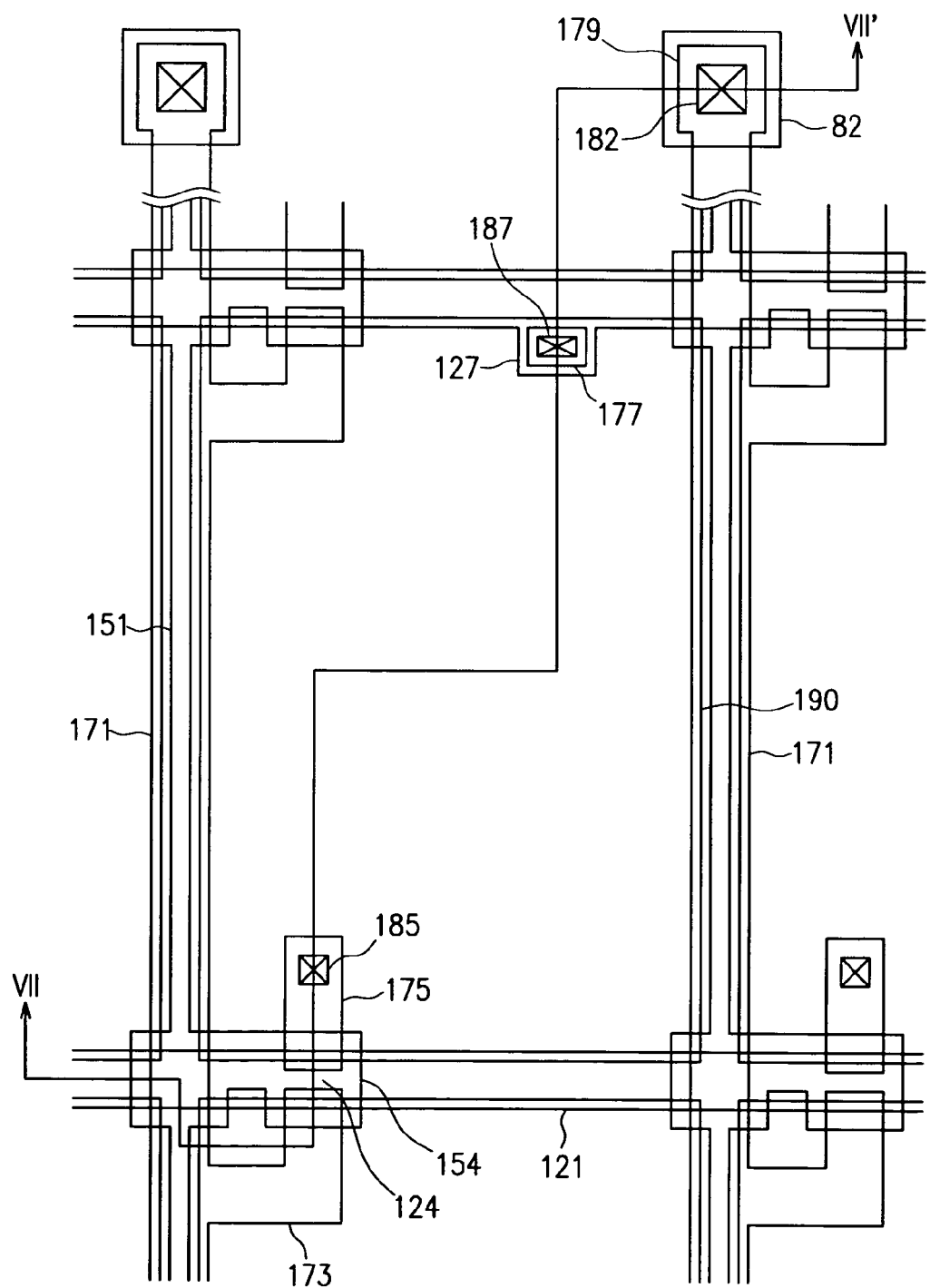
FIG. 6 is a layout view of a thin film transistor (TFT) of a display plate in accordance with an embodiment of the present invention.
Figure 7:
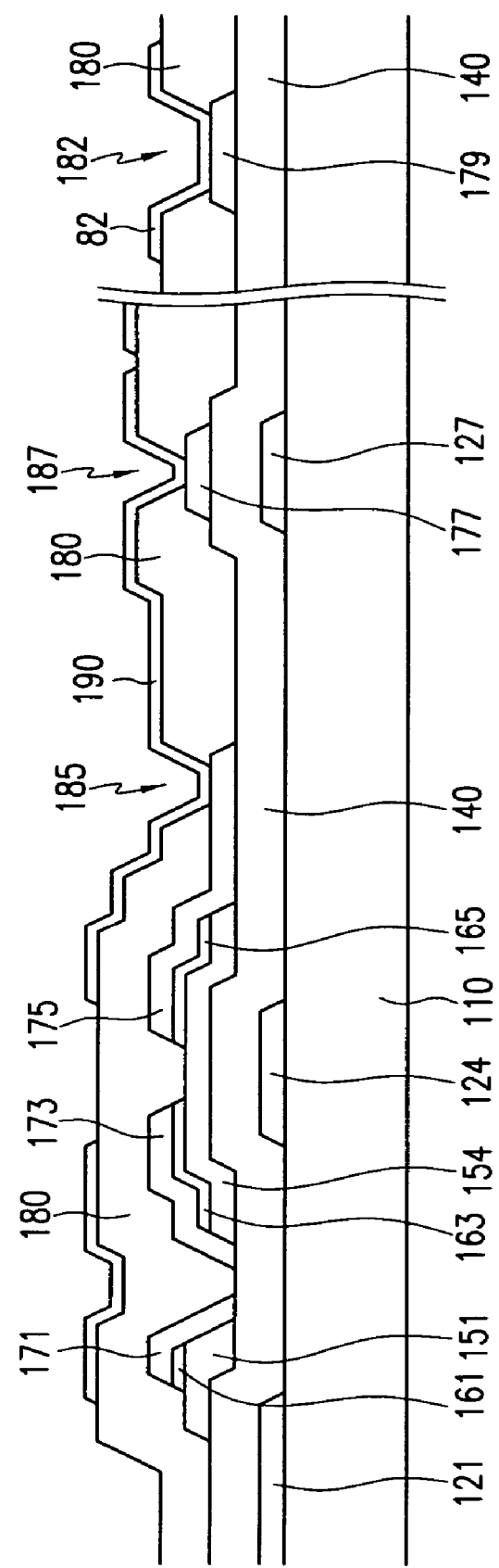
FIG. 7 is an exemplary cross-sectional view taken along the line VII-VII' of the thin film transistor of FIG. 6 in accordance with an embodiment of the present invention.
Figure 8:
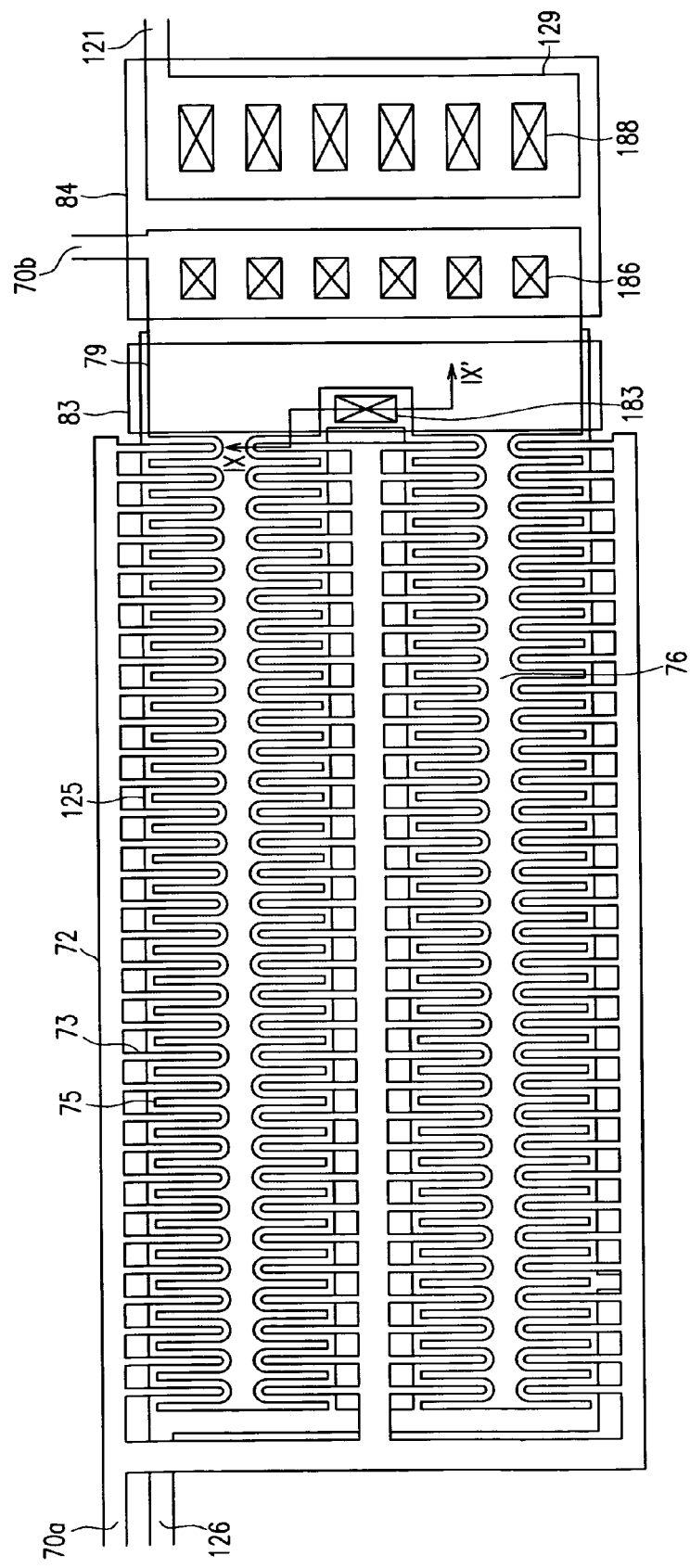
FIG. 8 is an exemplary layout view of a transistor and a capacitor of a stage in the gate driving portion in accordance with an embodiment of the present invention.
Figure 9:
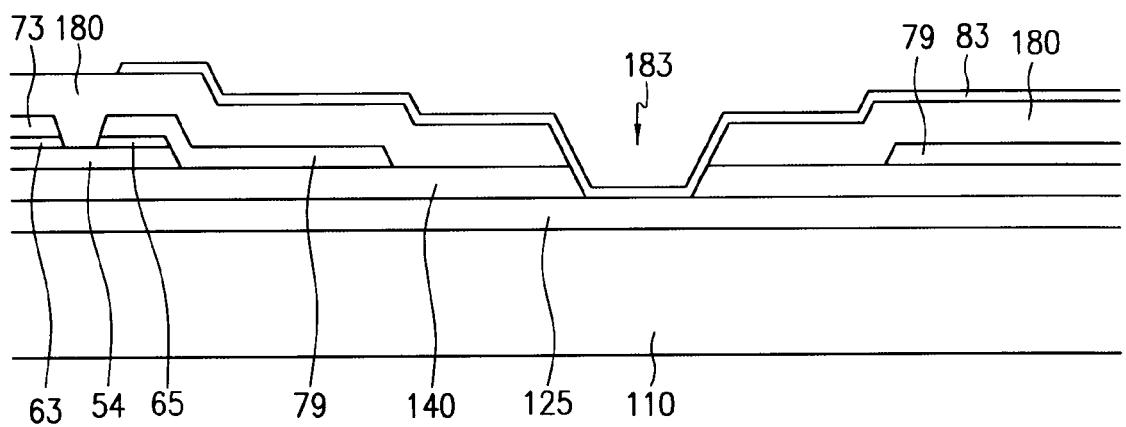
FIG. 9 is an exemplary cross-sectional view taken along the line IX-IX' of the transistor and the capacitor of FIG. 8 in accordance with an embodiment of the present invention.

An exemplary implementation of display portion 300 and the gate driving portion 400 are now explained in reference to FIGS. 6 to 9. FIG. 6 is a layout view of a thin film transistor (TFT) of a display plate according to one or more of the embodiments of the invention. FIG. 7 is an exemplary cross-sectional view taken along the line VII-VII' of the TFT of FIG. 6 in accordance with an embodiment of the present invention. FIG. 8 is an exemplary layout view of the transistor M10 and the capacitor C3 of a stage in the gate driving portion of FIG. 4 in accordance with an embodiment of the present invention. FIG. 9 is an exemplary cross-sectional view taken along the line IX-IX' of the transistor M10 and the capacitor C3 of FIG. 8 in accordance with an embodiment of the present invention.

A plurality of gate lines 121 and control lines 126 (e.g., as shown in FIG. 8) of the gate driving portion 400 are formed on the insulating plate 110 (e.g., as shown in FIG. 7). The gate lines 121 transmit gate signals and extend horizontally to the gate driving portion 400. A portion of each of the gate lines 121 is a gate electrode 124, and another portion is a plurality of projections 127. Also, each of the gate lines $G_1$-$G_n$ has a large area 129 connection portion (e.g., as shown in FIG. 8) at the end portion, close to the gate driving portion 400. A portion of the control signal line 126 is enlarged and forms a plurality of interconnected control electrodes 125 (e.g., as shown in FIGS. 8 and 9).

The gate line 121 and the control signal line 126 are made for example of a low resistivity conductive layer of silver metal series such as silver or silver alloy, an aluminum metal series such as aluminum or aluminum alloy, or a copper series such as copper or copper alloy. Additionally, the gate line can be a cumulated conductive metal layer such as Cr, Ti, Ta, Mo, or the alloy thereof (e.g., MoW alloy), which has good chemical, physical, and electrical contact properties with Indium Tin Oxide (ITO) and/or Indium Zinc Oxide (IZO). One example of the cumulate gate line is Cr/Al—Nd alloy. The gate line 121 and the control signal line 126 may be tapered about 30-80° to the surface of the insulating plate 110.

As shown in FIG. 7, a gate insulating layer 140, made of SiNx for example, covers the gate line 121 and the control signal line 126. A plurality of linear semiconductors 151 or island type semiconductors 54, made of for example hydrogenated amorphous silicon, are on the gate insulating layer 140. The linear semiconductor 151 extends vertically and has a plurality of extension portions 154 toward gate electrode 124. Also, the linear semiconductor 151 widens near the cross point with gate line 121 to cover the wide area of gate line 121. On the other hand, as shown in FIG. 9, the island type semiconductor 54 is located on the control electrode 125.

On the semiconductor layer 151, 54, a linear or island type silicide or highly doped n+ hydrogenated amorphous silicon may be formed as ohmic contacts 161, 165, 63, and 65. The linear ohmic contact 161 includes a plurality of the second protrusion 163, which is located on the first extension portion 154 of the linear semiconductor 151 in conjunction with the island type ohmic contact 165. Likewise, the other island type ohmic contacts 63, 65 form a pair and are located on the semiconductor 54. The ohmic contacts 161, 165, 63, and 65 of the semiconductor 151, 54 are tapered about 30-80° relative to the surface of the plate 11.

A plurality of data lines 171, a plurality of output electrodes 175, a plurality of storage capacitor conductors 177, input signal lines 70a, and output signal lines 70b are formed on the ohmic contacts 161, 165, 63, and 65 and gate insulating layer 140. Data line 171 transmits data (e.g., data voltages) by extending vertically and crossing with gate lines 121. A plurality of branches, extended from each data line 171 to the output electrodes 175, form input electrode 173. A pair of input and output electrodes 173, 175 are separated and face each other across gate electrode 124.

The input signal line 70a forks horizontally into three main branches near the control electrode 125 and forms input signal line connection portion 72 (e.g., as shown in FIG. 8). A plurality of branches vertically extends from the connection portion 72 in a comb shape and forms input electrode 73. The input signal line connection portion 72 is not overlapped with the control electrode 125, but a portion of the input electrode 73 overlaps with the control electrode 125. Hereinafter, input electrode portion refers to the combination of the input signal line connection portion 72 and the input electrode 73.

In addition, the output signal 70b expands at the other side of the forked point and forms an output electrode expansion portion 79, partially overlapped to the control electrode 125. An output signal line connection portion 76 extends from the output electrode expansion portion 79 to the space between input signal line connection portions 72. Output leads 75 are the branches extending from the output signal line connection portion 76, and both of the output leads 75 and the output signal line connection portion 76 are overlapped with the control lead 125. Hereinafter, the combination of the output signal line connection portion 76, the output leads 75, and the output electrode expansion portion 79 is referred to as output lead portion.

The gate electrode 124, input electrode 173, output electrode 175, and the extension portion 154 of the semiconductor 151 form a TFT of a pixel with a channel on the extension portion 154 and between input electrode 173 and the output electrode 175. Likewise, the control electrode 125, input electrode portion 72, 73, the output lead portion 75, 76, 79, and the semiconductor 54 form another TFT at the transistor M10 of the driving portion, with a channel on the semiconductor 54 and between the input electrode 73 and the output electrode 75. The channel portion has a U shape because the input electrode 73 and the output electrode 75 are disposed alternatively for example in one by one (interdigitated), in one by two or in a similar manner.

Additionally, as explained above, a part of the capacitor C3 of the gate driving portion is the gate insulating layer 140 between the output electrode portion 75, 76, 79, and the control electrode 125. The storage capacitor conductor 177 is overlapped with the projection portion 127 of the gate lines 121.

The data line 171, the output electrode 175, input signal line 70a, the output signal line 70b, and the storage capacitor conductor 177 are made for example of a low resistivity conductive layer of a silver metal series such as silver or silver alloy, an aluminum metal series such as aluminum or aluminum alloy, or a copper series such as copper or copper alloy. Additional conductive layers can be cumulated with the basic conductive layer. The additional conductive layer for example can be one of Cr, Ti, Ta, Mo, or the alloy thereof (e.g., MoW alloy), which has good chemical, physical, and electrical contact properties with ITO and/or IZO. One example of the cumulated conductive layers is Cr/Al—Nd alloy.

The lateral side of the data line 171, the output electrode 175, input signal line 70a, the output signal line 70b, and the storage capacitor conductor 177 is tapered about 30-80° to the surface of the plate 110. A plurality of linear or island type ohmic contacts 161, 165, 63, and 65 are only interposed between the lower semiconductor 151, 54 and the upper data lines 171, output electrode 175, input signal line 70a, or output signal line 70b for reducing contact resistance.

On the data line 171, output electrode 175, input signal line 70a, output signal line 70b, the storage capacitor conductor 177, and exposed semiconductor 151, 54, the passivation layer 180 for example can be made of an easily flattened and photosensitive organic material, low dielectric (e.g., less than 4.0), insulating material such as a-Si:C:o or a-Si:O:F formed by plasma enhanced chemical vapor deposition (PECVD) or an inorganic material such as SiNx. The passivation layer 180 also can be a double layer of organic and inorganic layers.

On the passivation layer 180, a plurality of contact holes 182, 185, 187, and 186 are formed to partially expose the area of the end portion 179 of the data lines 171, the output electrode 175, the storage capacitor conductor 177, and the output electrode expansion portion 79. Another plurality of contact holes are formed to partially expose the control electrode 125 and the connection portion 129 of the gate line 121 along with the gate insulating layer 140.

On the passivation layer 180, an ITO or IZO layer of a plurality of pixel electrodes 190, contact assistants 82, auxiliary electrodes 83, and connection assistants 84 are formed. Through the contact holes 185, 187, the pixel electrodes 190 are physically connected to the output electrode 175 for receiving the data voltage and connected to the storage capacitor conductor 177 for transmitting the data voltage.

Referring to FIG. 2, liquid crystal molecules of the liquid crystal layer 3 are rearranged according to the electric field, generated by the data voltage charged pixel electrode 190 and the common voltage charged common electrode 270. Also, as explained above, the capacitance between the pixel electrode 190 and the common electrode 270 remains after the TFT turns off. For enhancing the capacitance, an additional capacitor, called the storage capacitor $C_{ST}$, is provided in a parallel connection to the liquid crystal capacitor.

Rather than as shown in FIG. 2, the storage capacitor $C_{ST}$ can be made by overlapping the pixel electrode 190 with its neighboring gate line, the so called previous gate line. For enhancing the storage capacitance, the gate line 121 can include extensional portion 127 for a wider overlapped area, and furthermore, the storage capacitor conductor 177, connected to the pixel electrode and overlapped with the extensional portion 127, may be located under the passivation layer 180. Also, the pixel electrode 190 can be overlapped with the neighboring gate lines or data lines for a higher aperture ratio.

The contact assistant 82, which is optional, is connected to the data lines end portion 179 via contact hole 182 for enhancing an adhesive property with an external apparatus and protecting the data lines end portion 179. The auxiliary electrode 83 is connected to the control electrode 125 via contact hole 183 and is part of the capacitor C3 of the gate driving portion by being overlapped with the extension portion 79 of the output electrode. The overlapped auxiliary electrode 83 enhances the capacitance C3 between the gate and the source of the transistor M10. The enhancement of the capacitor is proportional to the dielectric constant as well as the overlapped area of the passivation layer 180 and inversely proportional to the thickness of the passivation layer 180.

For example, without considering the capacitance of other than the extension portion 79, if the gate insulating layer is about 4500 angstroms thick and the passivation layer is about 2000 angstroms thick, the output electrode extension portion 79 is closer to the auxiliary electrode 83 than the control electrode 125 by half. With the same dielectric constant of the gate insulating layer 140 and the passivation layer 180, the capacitance between the output electrode extension portion 79 and the auxiliary electrode 83 is twice the capacitance between the output electrode extension portion 79 and the control electrode 125.

Accordingly, the capacitance is enhanced by about three times with auxiliary electrode 83. As a result, due to sufficient capacitance in a relatively small area, the actual area of the gate driving portion 400 can be reduced, and consequently, the actual display portion can be enlarged. On the other hand, as explained above, the parasitic capacitance between the gate and the drain of the transistor M10 is remarkably small because the overlapping area of the input electrode portion 72, 73 and the control electrode 125 is remarkably smaller than the overlapping area of the output electrode portion 75, 76, 79 and the control electrode 125.

The connection assistant 84 is physically and electrically connected to the output electrode extension 79 and gate line connection portion 129 via contact hole 186, 188. Therefore, gate signal 121 is transferred from the output electrode extension 79 to gate line connection portion 129.

According to one or more embodiments of the present invention, transparent conductive polymer material can be used as the pixel electrode 190. Alternatively, for reflective LCD, opaque reflective metal also can be used as the pixel electrode 190. The contact assistant 82 can be made of a different material from the pixel electrode such as ITO and/or IZO.

According to one or more embodiments of the present invention, by shrinking the transistor M10 40-50 percent, the overall area of each stage can be reduced. Also, one or more embodiments of the present invention may prevent a short between the gate and the source of the transistor M10. As a result, the reliability of the gate driving portion is enhanced and the designing stage for the transistors is simplified.

Embodiments described above illustrate but do not limit the invention. It should also be understood that numerous modifications and variations are possible in accordance with the principles of the present invention. Accordingly, the scope of the invention is defined only by the following claims.

We claim:

1. A driving circuit of a display device, the driving circuit having a plurality of interconnected stages for transmitting sequential output signals, each of the stages comprising:
   a driving portion which transmits the output signal according to an input signal and a clock signal; and
   a discharging portion, which discharges a voltage charged in the driving portion, wherein the driving portion comprises:
   a control electrode;
   a first insulating layer on the control electrode;
   a semiconductor layer on the first insulating layer;
   an input electrode at least partially disposed on the semiconductor layer;
   an output electrode at least partially disposed on the semiconductor layer and over the control electrode, wherein the area of the section where the input electrode is over the control electrode is remarkably smaller than the area of the section where the output electrode is over the control electrode;
   a second insulating layer on the input electrode and the output electrode; and
   an auxiliary electrode disposed on the second insulating layer, connected to the control electrode, and overlapping the output electrode;
   wherein the input electrode and the output electrode each comprise a plurality of branches, interposed to each other.

2. The driving circuit of claim 1, wherein
   the output electrode further comprises an extension portion which is connected to the branches and overlapped with the auxiliary electrode.

3. The driving circuit of claim 2, wherein the branches of the output electrode and the input electrode are interdigitated.

4. The driving circuit of claim 2, wherein the first insulating layer and the second insulating layer comprise contact holes for exposing the control electrode and wherein the auxiliary electrode is connected to the control electrode via at least one of the contact holes.

5. The driving circuit of claim 4, wherein the auxiliary electrode comprises a transparent conductive material.

6. The driving circuit of claim 5, wherein the auxiliary electrode comprises at least one of an ITO and an IZO.

7. The driving circuit of claim 4, wherein a capacitance between the control electrode and the output electrode is greater than a capacitance between the control electrode and the input electrode.

8. The driving circuit of claim 1, wherein the semiconductor layer comprises an amorphous silicon.

9. The driving circuit of claim 8, wherein the driving portion is formed on the display device.

10. The driving circuit of claim 1, wherein the display device is selected from a group of a Liquid Crystal Display and an Organic Light Emitting Display.

11. A method of providing a display driver, the method comprising:
    providing a control electrode;
    providing a first insulating layer on the control electrode;
    providing a semiconductor layer on the first insulating layer;
    providing an input electrode at least partially disposed on the semiconductor layer;
    providing an output electrode at least partially disposed on the semiconductor layer and over the control electrode, wherein the area of the section where the input electrode is over the control electrode is remarkably smaller than the area of the section where the output electrode is over the control electrode;
    providing a second insulating layer on the input electrode and the output electrode; and
    providing an auxiliary electrode disposed on the second insulating layer, connected to the control electrode, and overlapping the output electrode;
    wherein the input electrode and output electrode each form a plurality of branches, interposed with each other.

12. The method of claim 11, wherein a portion of the output electrode connected to the branches and overlapped with the auxiliary electrode.

13. The method of claim 12, wherein the branches of the input electrode and the output electrode are interdigitated.

14. The method of claim 12, further comprising providing contact holes in the first and second insulating layers to expose the control electrode, wherein the auxiliary electrode is connected to the control electrode via at least one of the contact holes.

15. The method of claim 11, further comprising providing a capacitance between the control electrode and the output electrode to be greater than a capacitance between the control electrode and the input electrode.

16. The method of claim 11, further comprising forming the display driver as a part of a display device.

* * * * *

UNITED STATES PATENT AND TRADEMARK OFFICE
CERTIFICATE OF CORRECTION

PATENT NO. : 7,576,723 B2 Page 1 of 1
APPLICATION NO. : 10/971365
DATED : August 18, 2009
INVENTOR(S) : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1099 days.

Signed and Sealed this

Seventh Day of September, 2010

David J. Kappos
*Director of the United States Patent and Trademark Office*